(12) United States Patent
Lu et al.

(10) Patent No.: US 11,762,437 B2
(45) Date of Patent: Sep. 19, 2023

(54) EXPANSION FAN DEVICE WITH ADJUSTABLE FAN

(71) Applicant: HEWLETT PACKARD ENTERPRISE DEVELOPMENT LP, Houston, TX (US)

(72) Inventors: Hsin Chang Lu, Taipei (TW); Phoebus Lin, Taipei (TW)

(73) Assignee: Hewlett Packard Enterprise Development LP, Spring, TX (US)

( * ) Notice: Subject to any disclaimer, the term of this patent is extended or adjusted under 35 U.S.C. 154(b) by 640 days.

(21) Appl. No.: 16/713,750

(22) Filed: Dec. 13, 2019

(65) Prior Publication Data
US 2021/0181817 A1 Jun. 17, 2021

(51) Int. Cl.
*G06F 1/20* (2006.01)
*G06F 1/18* (2006.01)
*G06F 13/42* (2006.01)
*H05K 7/20* (2006.01)
*G05B 23/02* (2006.01)

(52) U.S. Cl.
CPC ........... *G06F 1/20* (2013.01); *G05B 23/0267* (2013.01); *G06F 1/185* (2013.01); *G06F 1/206* (2013.01); *G06F 13/4221* (2013.01); *H05K 7/20145* (2013.01); *H05K 7/20172* (2013.01); *H05K 7/20209* (2013.01); *G06F 2213/0026* (2013.01)

(58) Field of Classification Search
CPC ....... G05B 23/0267; G06F 1/20; G06F 1/185; G06F 1/206; G06F 13/4221; G06F 2213/0026; G06F 1/183; H05K 7/20145; H05K 7/20172; H05K 7/20209; H05K 7/20727
See application file for complete search history.

(56) References Cited

U.S. PATENT DOCUMENTS

| | | | |
|---|---|---|---|
| 6,795,315 B1* | 9/2004 | Wu | H01L 23/467 174/16.3 |
| 10,521,376 B1* | 12/2019 | Mitra | G06F 3/0632 |
| 2002/0172008 A1* | 11/2002 | Michael | H01L 23/467 361/720 |
| 2006/0117779 A1* | 6/2006 | Liebenow | G01K 13/00 62/126 |

(Continued)

FOREIGN PATENT DOCUMENTS

| | | | |
|---|---|---|---|
| CN | 202615306 U | * | 12/2012 |
| CN | 203067365 U | * | 7/2013 |

(Continued)

OTHER PUBLICATIONS

Machine translation of KR 2010-0010033 U from ip.com (Year: 2010).*

(Continued)

*Primary Examiner* — Glenn A. Auve
(74) *Attorney, Agent, or Firm* — Nolte Intellectual Property Law Group

(57) ABSTRACT

A fan device may include a an expansion card, a fan, and a mounting mechanism. The expansion card may mechanically and communicatively connect to a computing system. The mounting mechanism mounts the fan within an opening in the expansion card. The mounting mechanism further permits the fan to move relative to the expansion card.

16 Claims, 13 Drawing Sheets

(56) References Cited

U.S. PATENT DOCUMENTS

| | | | | |
|---|---|---|---|---|
| 2007/0000649 | A1* | 1/2007 | Peng | G06F 1/20 165/121 |
| 2007/0047200 | A1* | 3/2007 | Huang | H05K 7/20172 361/695 |
| 2007/0121289 | A1* | 5/2007 | Peng | G06F 1/20 257/E23.099 |
| 2007/0211432 | A1* | 9/2007 | Peng | H01L 23/467 361/700 |
| 2011/0002098 | A1* | 1/2011 | Xu | H01L 23/34 361/688 |
| 2014/0117908 | A1* | 5/2014 | Busch | H02P 1/04 318/471 |
| 2015/0108934 | A1* | 4/2015 | Wong | F04D 25/0613 318/472 |
| 2015/0346783 | A1* | 12/2015 | Kinstle, III | H05K 7/20509 361/679.48 |
| 2017/0350403 | A1* | 12/2017 | Kelly | F04D 27/001 |
| 2018/0284852 | A1* | 10/2018 | Rannow | H01L 23/473 |
| 2018/0310437 | A1* | 10/2018 | Anderl | H05K 7/20172 |
| 2019/0116688 | A1* | 4/2019 | Chu | G06F 1/203 |
| 2019/0324506 | A1* | 10/2019 | Shabbir | G06F 3/0632 |
| 2020/0053910 | A1* | 2/2020 | Chen | G06F 1/206 |
| 2020/0154600 | A1* | 5/2020 | Gupta | H05K 7/20209 |
| 2021/0103319 | A1* | 4/2021 | Chang | H05K 5/0226 |
| 2021/0294397 | A1* | 9/2021 | Haley | G06F 1/20 |
| 2021/0318976 | A1* | 10/2021 | Zhang | G06F 13/4282 |

FOREIGN PATENT DOCUMENTS

| | | | | |
|---|---|---|---|---|
| KR | 2010010033 U | * | 10/2010 | G06F 1/00 |
| WO | WO-2021262714 A1 | * | 12/2021 | G06F 1/00 |

OTHER PUBLICATIONS

Anidees Graphic Card Cooler 3 x 80mm PWM Fan, Support Aura Sync/MSI Mystic Sync/ASROCK Aura RGB/Gigabyte RGB Fusion product page; Amazon.com; accessed at <URL:https://www.amazon.com/anidees-Graphic-GIGABYTE-Addressable-AI-GP-CL/dp/B07Y6CY6GL> on Apr. 6, 2022; Date First Available Sep. 21, 2019. (Year: 2019).*

Machine translation of CN 202615306 U (Year: 2012).*

Machine translation of CN 203067365 U (Year: 2013).*

* cited by examiner

EXPANSION FAN DEVICE WITH ADJUSTABLE FAN

BACKGROUND

Electronic components (e.g., processing, memory, and peripheral or expansion components) included in computing systems, such as servers, generate heat during their operation. Accordingly, to prevent overheating and damage to the electronic components, cooling systems have been implemented in many computing systems to maintain the electronic components at acceptable operational temperatures. As speed and power consumption expectations of computing systems continue to increase and as more electronic components are included within a computing system, an expected challenge is removal of the heat generated by the electronic components operating within these systems.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion. Features of the present disclosure are illustrated by way of example and not limited in the following figures, in which like numerals indicate like elements, in which.

DETAILED DESCRIPTION

Figure 1:
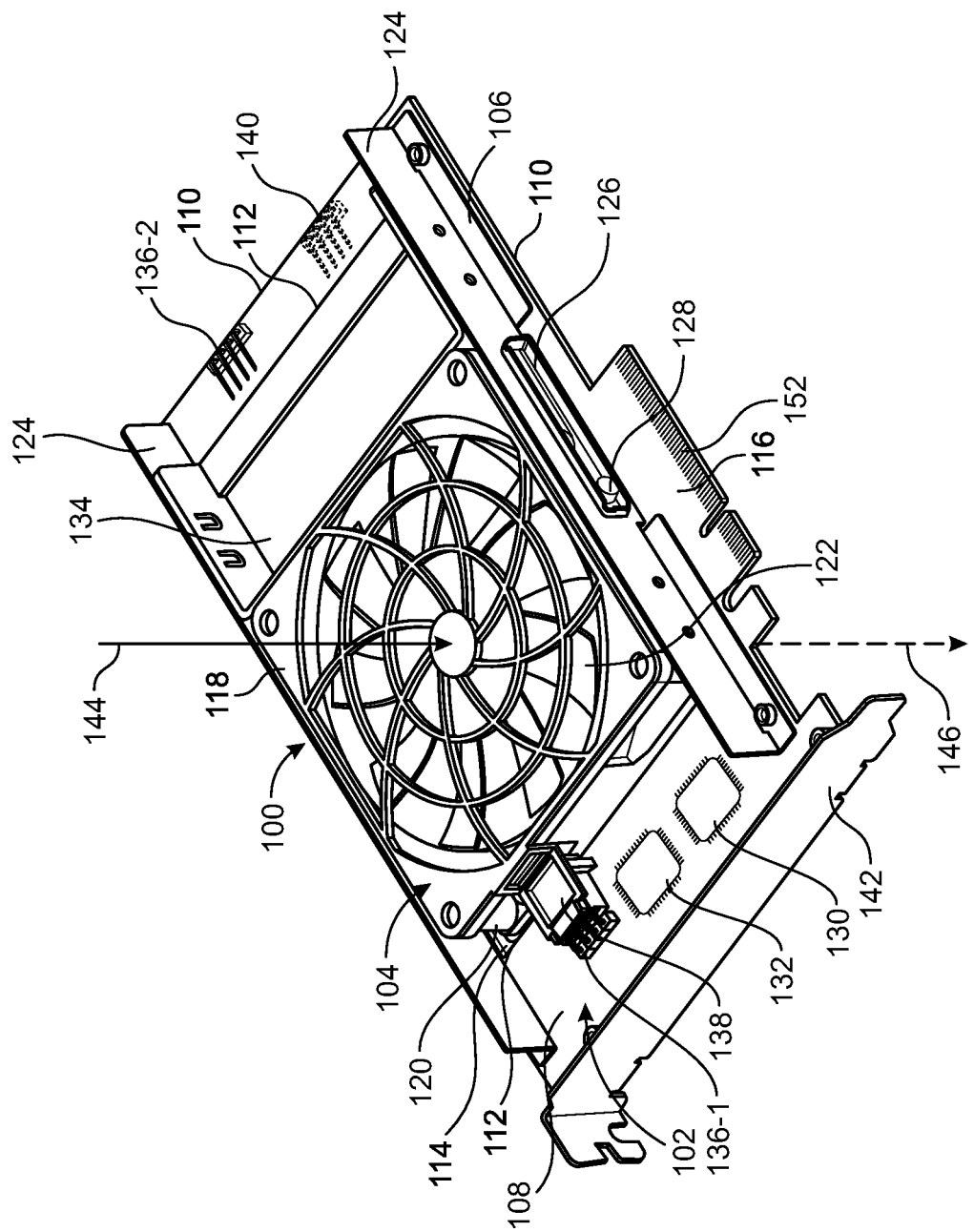
FIG. 1 depicts a fan device, according to one or more examples of the present disclosure.

Illustrative examples of the subject matter claimed below will now be disclosed. In the interest of clarity, not all features of an actual implementation are described in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

System fans within a computing system may provide insufficient airflow to adequately cool all the devices within the computing system. To address this shortcoming, additional fans may be added to the computing system. However, existing fan mechanisms may not provide sufficient flexibility to cool certain devices, such as expansion devices that may have different orientations within the computing systems depending, for instance, on where and how a connector is oriented into which the expansion device is inserted.

Disclosed herein is a fan device that can be installed into a computing system to provide forced air cooling for heat-generating components of the computing system. The fan device includes an expansion card to mechanically and communicatively connect to a computing system, a fan, and a mounting mechanism to mount the fan to the expansion card. The mounting mechanism permits the fan to move relative to the expansion card.

For example, the mounting mechanism permits the fan to rotate, e.g., at least 180 degrees, relative to a surface of the expansion card, through to a position orthogonal to the surface of the expansion card. This rotation can enable the fan to cool a heat-generating component that is inserted into the computing system such that it is adjacent to either side of the expansion card. In another example, the mounting mechanism may permit the fan to translate linearly relative to the expansion card. This translational movement can allow the fan to be moved closer to the heat-generating source.

Additionally, the fan device can include an airflow directing mechanism that can direct more air toward the heat-generating source and reduce re-circulating the air into the computing system in which the fan device is installed. For example, the airflow directing mechanism can be an insert for an opening between the fan and the expansion card when the fan is mounted to the expansion card. Additionally, the expansion card can conform to a standard form factor to allow aftermarket inclusion of the fan device in existing computing systems. For example, the expansion card can have a Peripheral Component Interconnect Express form factor.

Finally, the fan device can include a means of communicating between the fan device and the computing system in which the fan device is installed. For example, the fan device can include a controller, such as a microcontroller unit, mounted to the expansion card. The controller can communicatively couple the fan to the computing system through the expansion card. The controller can allow features including identifying the presence or absence of the fan device within the computing system, controlling fan speed depending, for instance, on a temperature of the heat-generating component, and detecting and reporting a failure in the fan device.

Turning now to the drawings, FIG. 1 depicts a fan device 100, according to one or more examples of the present disclosure. The illustrated fan device 100 includes an expansion card 102 to mechanically and communicatively couple to a computing system (not shown in FIG. 1), a fan 104, a mounting mechanism 106 to mount the fan 104 to the expansion card 102, an airflow directing mechanism 134, and a face panel 142 connected to the expansion card 102.

As used herein, an "expansion card" is a printed circuit board that may be connected, plugged, or inserted into a connector of a computing system to expand functionality or capability of the computing system. A device that includes an expansion card is also referred to herein as an "expansion device" or a "peripheral device." Accordingly, a fan device that includes an expansion card, such as the fan device 100, may also be referred to as an "expansion fan device" and can be used to expand the cooling functionality or capability of a computing system into which the expansion fan device is connected, plugged, or inserted. Additionally, as used herein, a "computing system" is a system that includes at least one connector into which an expansion fan device according to the present teachings, e.g., the fan device 100, may be connected, plugged, or inserted and further includes at least one "heat-generating component" designed to perform a given functionality and which generates heat during operation, which may be cooled by the expansion fan device.

The expansion card 102 includes a pair of opposing parallel sides or surfaces 108 (with only one being shown). The opposing sides 108 may also be referred to herein as longitudinal sides or longitudinal surfaces. A plurality of lateral sides or edges 110 and 112 connect the opposing sides 108. For example, the expansion card 102 is formed from a plurality of layers of non-conductive substrate, the thickness of which determines a height of the edges 110 and 112. Conductive tracks or traces and pads (neither shown) may be etched, for instance from one or more layers of copper, onto and/or between the substrate layers to electrically connect one or more electrical or electronic components mounted to the expansion card 102.

As illustrated, an opening 114 is formed through the pair of opposing sides 108. Accordingly, the expansion card 102 has both external edges 110 (with only two being labeled) forming an external boundary around the expansion card 102 and internal edges 112 (with only two being labeled) forming an internal boundary around the opening 114. The face panel 142 may be attached, e.g., glued, fastened such as with screws or other fasteners, or otherwise secured, to an external edge 110 of the expansion card 102. As illustrated, the face panel 142 is attached to an external edge 110 along a width of the expansion card 102.

Also, extending from one of the external edges 110 is an edge connector 116. As illustrated, the edge connector 116 is shaped to mechanically engage with and connect to a mated or matching connector, socket, or plug of a computing system. Although the edge connector 116 is shown extending from a particular edge of the expansion card 102, the placement, dimensions, and other features of the edge connector 116 or any other type of connector 116 that mates with a connector on a computing system may be based on a standard with which the connector 116 and/or the mated connector conforms, space constraints within the computing system, location of the mated connector within the computing system, etc.

As further illustrated, the edge connector 116 includes a plurality of conductive traces and/or pins 152 to facilitate a communicative coupling or connection between a computing system and one or more electrical or electronic components mounted and electrically connected to the expansion card 102. As used herein, an "communicative coupling or connection" allows or enables one or more of electrical, communication, and/or optical signals to pass between two systems and/or devices, e.g., between the fan device 100 and a computing system.

For example, the communicative coupling or connection between the fan device 100 and a computing system may allow or enable the computing system to deliver electrical signals such as electrical energy from a power supply, for instance a main power supply, to the fan device 100 to power the fan 104. In another example, the communicative coupling or connection allows or enables communication signals including information, data, or commands to pass between two systems and/or devices, e.g., between the fan device 100 and a computing system. For a particular example, a communicative coupling or connection between the fan device 100 and a computing system may allow or enable the fan device 100 to communicate information or data, such as an identifier for the fan device 100, to the computing system. Moreover, the communicative coupling or connection between the fan device 100 and the computing system may allow or enable the computing system to send command signals to the fan device 100 to control operation of the fan 104, e.g., to turn the fan 104 ON and OFF and/or adjust the speed of the fan 104.

One or more "standard," i.e., accepted by and used in the industry, and/or proprietary protocols may be used to facilitate communications, i.e., the passing of electrical, optical, and/or communication signals, between the fan device 100 and a computing system. In a particular example, a layered protocol specified by the Peripheral Component Interconnect Express ("PCIe" or "PCI Express") standard is used to facilitate communications between the fan device 100 and a computing system.

Further to this particular example, the expansion card 102 has a "standard PCIe form factor," i.e., is a "PCI Express card" that fits within a "PCI Express slot." As used herein, a "PCI Express card" is of a type and has dimensions that conform to the types (e.g., full-length, half-length, low-profile, Mini PCIe) and corresponding dimensions specified in the PCI Express standard. As further used herein, a "PCI Express slot" has dimensions that conform to the dimensions (e.g., x1, x2, x4, x8, x12, x16, x32) specified in the PCI Express standard and is capable of mating with a "PCI Express edge connector" having dimensions and a pinout that conforms to the PCI Express standard. In other implementations, the expansion card 102 may have a non-standard form factor or may be implemented using a different standard such as, Infiniband, RapidO, HyperTransport, Intel Quickpath Interconnect, etc. Moreover, additional or alternative protocols may be implemented to facilitate communications between the expansion card 102 and the computing system, such as Inter-integrated Circuit ("I2C") serial communication protocol.

As illustrated, the fan device 100 includes a plurality of components mounted and electrically connected to the expansion card 102, and which may be electrically connected to each other, for instance using a plurality of traces (not shown) etched into the expansion card 102. As illustrated, the plurality of components includes two connectors 136-1 and 136-2 (collectively referred to as connectors 136 and also individually referred to as a connector 136), a controller 130 (also referred to herein as a fan controller), and a memory device 132. Also, one or more connectors 140 may optionally be mounted and electrically connected to the expansion card 102 and to one or more of the other mounted components, for instance the controller 130.

The connectors 136 may mechanically mate with a connector 138 of the fan to, thereby, provide an electrical and/or communicative coupling between the fan 104 and the controller 130 mounted to expansion card 102 and/or between the fan 104 and the edge connector 116. For example, when the connectors 136 and 138 are mated, a resulting communicative coupling between the fan 104 and the controller 130 may allow or enable the controller 130 to detect and store a status of the fan 104 (for instance whether the fan 104 is operational or has failed or the speed of the fan 104) and to issue commands to the fan 104, for instance to turn the fan 104 ON and OFF and to speed up or slow down the fan 104.

In another example, when the connectors 136 and 138 are mated, a resulting communicative coupling between the fan 104 and the edge connector 116 may allow the fan 104 to receive electrical energy from the computing system to power the fan 104 through a pin on the edge connector 116, for instance when the computing system is turned ON. In a further example, the connector 138 includes a switching circuit (not shown) to detect whether electrical energy is being received from the edge connector 116, and thereby from a main power supply of the computing system.

When the electrical energy is not being received from the main power supply, for instance when the computing system is in a STANDBY mode, the switching circuit of the connector 138 may perform a switching function to allow the fan to couple to and be powered by an auxiliary power supply, for instance within the computing system. In yet another example where a switching circuit is absent from the connector 138, separate connections may be used for coupling to the main power supply and the auxiliary power supply. For example, the connection between connectors 136 and 138 may only allow the fan 104 to be powered by the main power supply and a separate connection between a connector on the fan 104 (not shown) and the connector 140 may allow the fan 104 to be powered by the auxiliary power supply.

One of the two connectors 136 is mounted near each end of the expansion card 102 to mate with the connector 138 depending on the orientation of the fan 104 relative to the expansion card 102, more particularly relative to the surfaces 108 of the expansion card 102. For example, in the illustrated orientation of the fan 104, the connector 136-1 is mated with the connector 138. However, when the fan 104 is rotated 180 degrees relative to the surfaces 108 of the expansion card 102, in accordance with one or more examples the present disclosure, the connector 136-2 may mate with the connector 138.

In an example implementation, the memory device 132 may store an identifier for the fan device 100. The identifier may have any suitable format. The controller 130 may communicatively couple to a computing system to communicate the identifier for the fan device 100 through the expansion card 102, for instance to indicate the presence of the expansion card 102 in the mated slot of the computing system. In a particular implementation, the connection between the edge connector 116 and a mated connector on the computing system may allow and enable a communicative coupling between the controller 130 and a management controller on a main circuit board of the computing system. The controller 130 may communicate the identifier for the fan device 100 to the management controller using this communicative coupling. In another implementation, conductive traces (not shown) between the memory device 132 and the edge connector 116 allow a communicative coupling between the memory device 132 and the management controller (of the computing system) so that the management controller may read the identifier stored on the memory device 132.

In a further implementation, the communicative coupling between the controller 130 and a management controller on a main circuit board (not shown) of the computing system may allow information or data to be communicated between the controller 130 and the management controller. Such information or data may be, for instance, fan device status and fan speed as well as commands to adjust fan speed. In a particular example, the controller 130 and the management controller communicate using I2C protocol.

The controller 130 may be a microcontroller unit ("MCU") having a processor and memory device or some other combination of one or more processors and one or more memory devices. The memory device 132 may be a form of persistent memory such as an electrically erasable programmable read-only memory ("EEPROM").

The fan 104 includes a pair of opposing parallel sides or surfaces 118 (with only one being shown in the top-side perspective view). A plurality of external lateral sides or edges 120 (four in this case, with only one being labeled) connect the opposing sides 118 and form an external boundary around the fan 104. Internal to the fan 104 are components including fan blades 122, a motor (not shown) to operate the blades, and additional circuitry (not shown) to enable powering and communicating with the motor, for instance to change the speed of the fan blades 122.

The mounting mechanism 106 includes a pair of rails 124 and a pair mounting pins 128 (with only one shown), and permits the fan 104 to move relative to the expansion card 104. Each rail 124 is attached, e.g., glued, fastened such as with screws or other fasteners, or otherwise secured, to the expansion card 102. For example, each rail 124 is attached near an external edge 110 along a length of the expansion card 102. Each mounting pin 128 connects to an external edge 120 of the fan 104 and extends through an opening 126 (only one shown) in a respective rail 124 to mount the fan 104 within the opening 114 of the expansion card 102. As depicted, the fan 104 is mounted in an operating position, such that the pair of opposing surfaces 118 of the fan 104 are positioned parallel to the pair of opposing surfaces 108 of the expansion card 102. The "operating position" of the fan 104 is the position of the fan 104 during normal operation when the fan 104 is creating an airflow therethrough.

Arrows 144 and 146, respectively, represent airflow into (an "inlet") and out of (an "outlet") of the fan 104. The airflow is in a direction perpendicular to the pair of opposing surfaces 118 of the fan 104 and the pair of opposing surfaces 108 of the expansion card 102, when the fan 104 is in the operating position.

Upon mounting the fan 104 to the expansion card 102, a portion of the opening 114 remains, within which the airflow directing mechanism 134 may be positioned. The airflow mechanism 134 may be one or more pieces of material that fills or substantially fills the portion of the opening 114, when the fan is in the operating position. The material may be any suitable material including a plastic, composite, resin, etc. In an example, the airflow directing mechanism 134 is secured, e.g., fastened, into position. As illustrated, the airflow directing mechanism 134 is positioned between an external edge 120 of the fan 104 and an internal edge 110 of the expansion card 102. The airflow directing mechanism 134 may act to prevent the air from re-circulating back through the opening, thereby allowing more airflow to be directed toward a heat source of a heat-generating component. Accordingly, inclusion of the airflow directing mechanism 134 allows an increased airflow toward the heat-generating component than when the airflow directing mechanism 134 is absent.

FIGS. 2-7 depict a fan device 200 illustrated in the respectively drawings as fan device 200-1, 200-2, 200-3, 200-4, 200-5, 200-6, according to one or more examples of the present disclosure. The fan device 200 includes an expansion card 202, a fan 204, a mounting mechanism 206 to mount the fan 204 to the expansion card 202, and an airflow directing mechanism 234. The fan device 200 may be structurally and operationally similar to or the same as the fan device 100 of FIG. 1. However, some details of the fan device 100 are are omitted from the illustrated fan device 200 for ease of description.

Collectively, FIGS. 2-7 illustrate movement of the fan device 200 relative to an expansion card. For example, some of the FIGS. 2-7 illustrate how the mounting mechanism 206 permits the fan 204 to rotate within an opening 214 of the expansion card 202. Other of the FIGS. 2-7 illustrate how the mounting mechanism 206 permits the fan 204 to translate linearly relative to the expansion card 202.

Moreover, each of the FIGS. 2-7 depicts the fan device 200 in one of six different positional states 1-6. A different "positional state" of a fan device denotes that at least the position of the fan has changed or the presence or absence of the airflow directing mechanism has changed. Within each drawing, the fan device 200 is labeled according to a given positional state, with the components of the fan device 200 labeled the same across the FIGS. 2-7. For example, when the fan device 200 has a positional state 1, the fan device 200 is labeled 200-1. When the fan device 200 has a positional state 2, the fan device 200 is labeled 200-2, and so on. However, the expansion card 202, fan 204, mounting mechanism 206, airflow directing mechanism 234 and features thereof are labeled the same across all the FIGS. 2-7.

Figure 2:
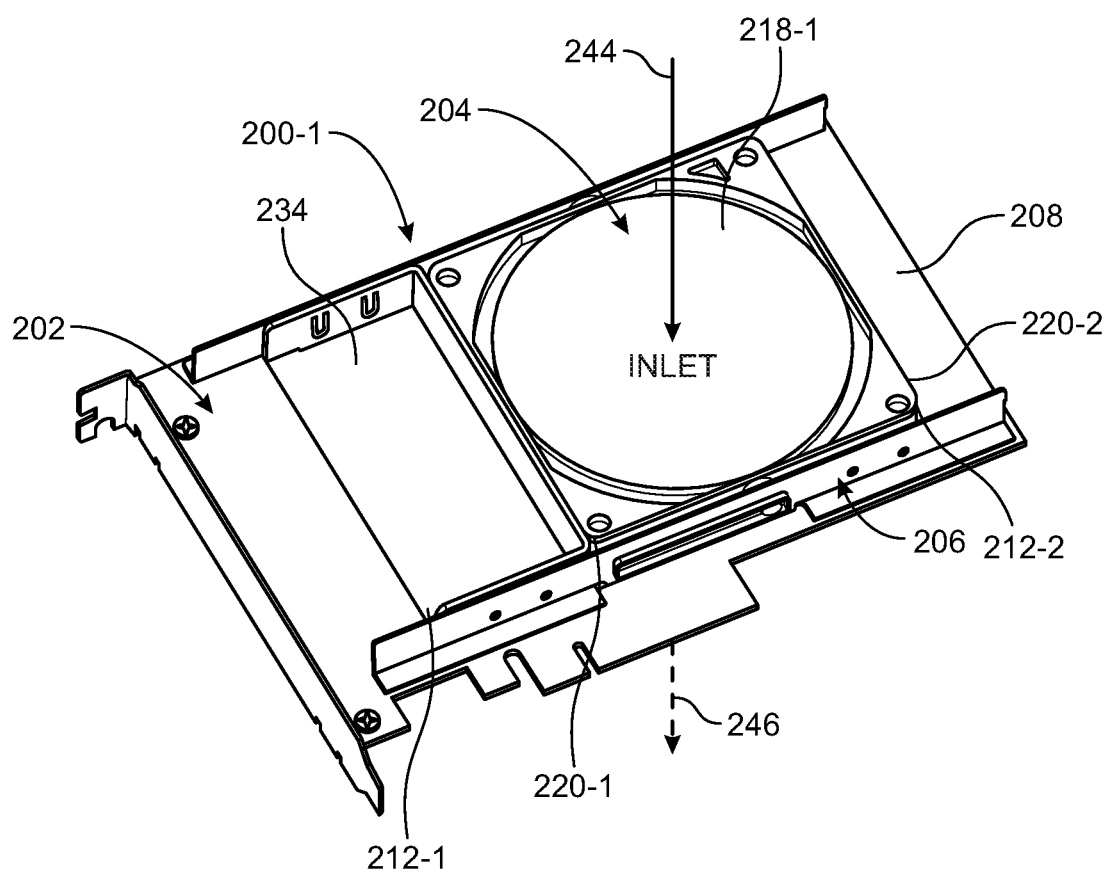
FIGS. 2-7 depict a second fan device in different positional states, according to one or more examples of the present disclosure.

In positional state 1 of the fan device 200-1 illustrated in FIG. 2, the fan 204 is mounted in an operating position. In the operating position, a pair of opposing surfaces 218-1 and 218-2 (collectively referred to as the pair of opposing surfaces 218) of the fan 204 are positioned parallel to a pair of opposing surfaces 208 (only one shown) of the expansion card 202. Additionally, in positional state 1, an external lateral side 220-2 of the fan 204 is adjacent to an internal lateral side 212-2 of the expansion card 202. Two sides, edges, or surfaces are "adjacent" when there is no element or component or part thereof positioned between the two sides, edges, or surfaces. In a particular implementation, the lateral side 220-2 of the fan 204 and the lateral side 212-2 of the expansion card 202 make partial or full contact.

Further, in positional state 1, the airflow directing mechanism 234 is positioned between an external lateral side 220-1 of the fan 204 and an internal lateral side 212-1 of the expansion card 202. In a particular implementation, sides of the airflow directing mechanism 234 partially or fully contact the lateral side 220-1 of the fan 204 and the lateral side 212-1 of the expansion card 202. As illustrated, arrows 244 and 246, respectively, represent airflow into an inlet and out of an outlet of the fan 204. The airflow is in a direction perpendicular to the pair of opposing surfaces 218 of the fan 204 and the pair of opposing surfaces 208 of the expansion card 202.

Figure 3:
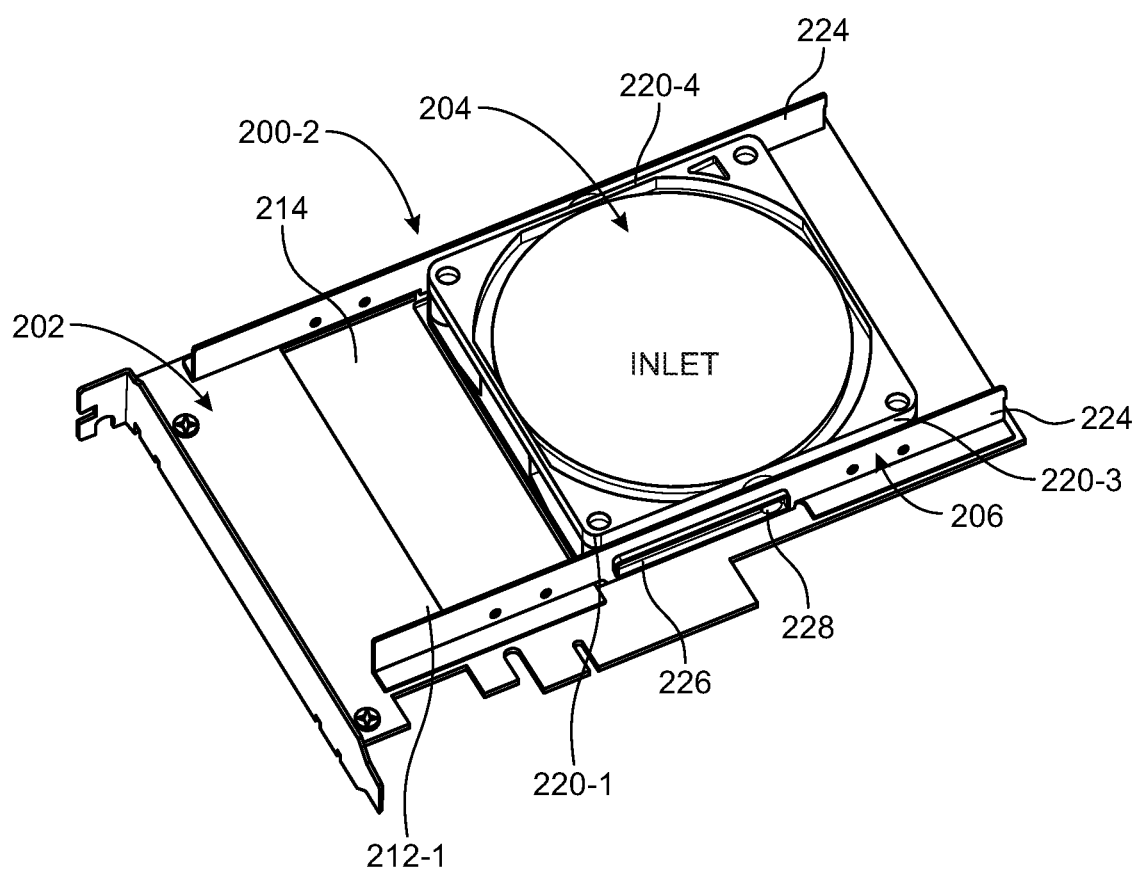

In positional state 2 of the fan device 200-2 illustrated in FIG. 3, the airflow directing mechanism 234 is removed, and therefore not shown, leaving uncovered a portion of the opening 214 between the lateral side 220-1 of the fan 204 and the lateral side 212-1 of the expansion card 202. In an implementation, the airflow directing mechanism 234 is detached from the expansion card 202 prior to removal. Removal of the airflow directing mechanism 234, allows the fan 204 to translate linearly relative to the expansion card 202. Particularly, a pair of mounting pins 228 (only one shown) each connecting to a respective external edge 220-3, 220-4 of the fan 204 and extending through an opening 226 (only one shown) in a respective rail 224 of the mounting mechanism 206 permits the fan 204 to translate linearly relative to the expansion card 202.

Figure 4:
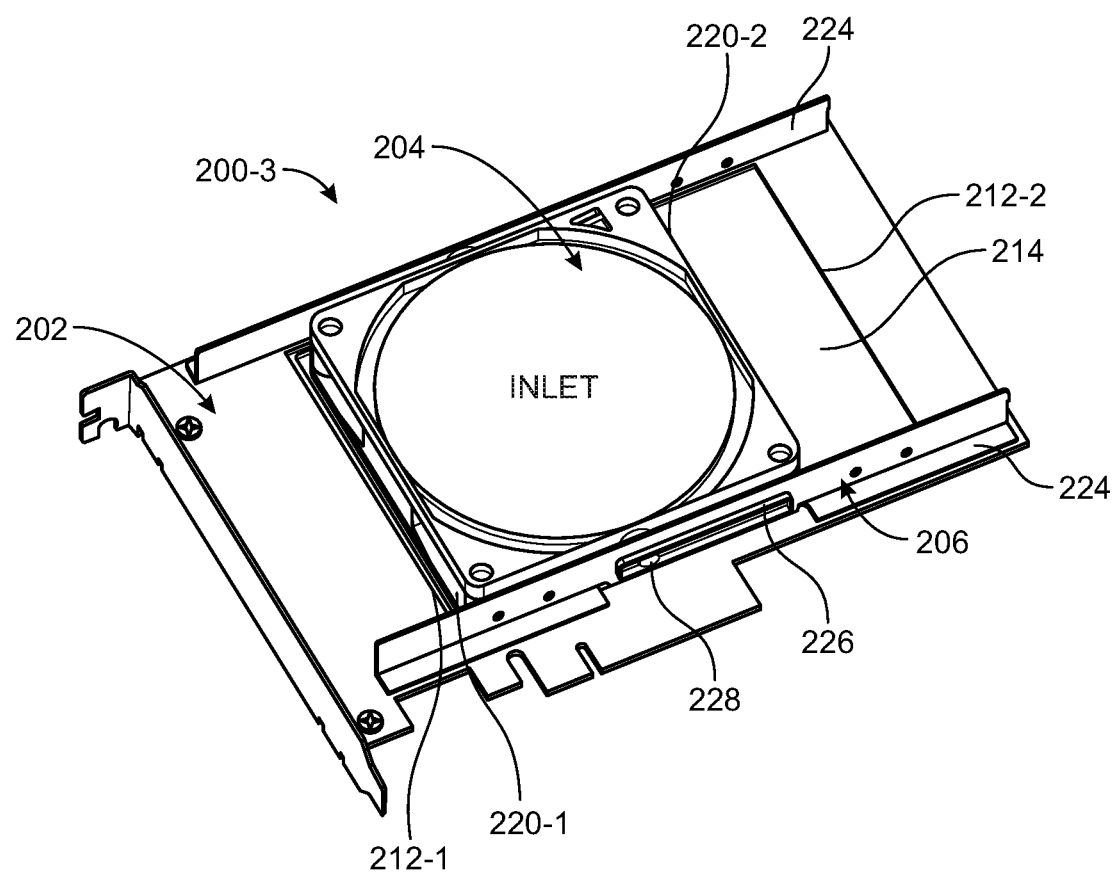

In positional state 3 of the fan device 200-3 illustrated in FIG. 4, the fan 204 has been moved such that the external lateral side 220-1 of the fan 204 is adjacent to the internal lateral side 212-1 of the expansion card 202. For example, the lateral side 220-1 of the fan 204 and the lateral side 212-1 of the expansion card 202 make partial or full. Moving the fan 204 causes a portion of the opening 214 to extend between the lateral side 220-2 of the fan 204 and the lateral side 212-2 of the expansion card 202.

Figure 5:
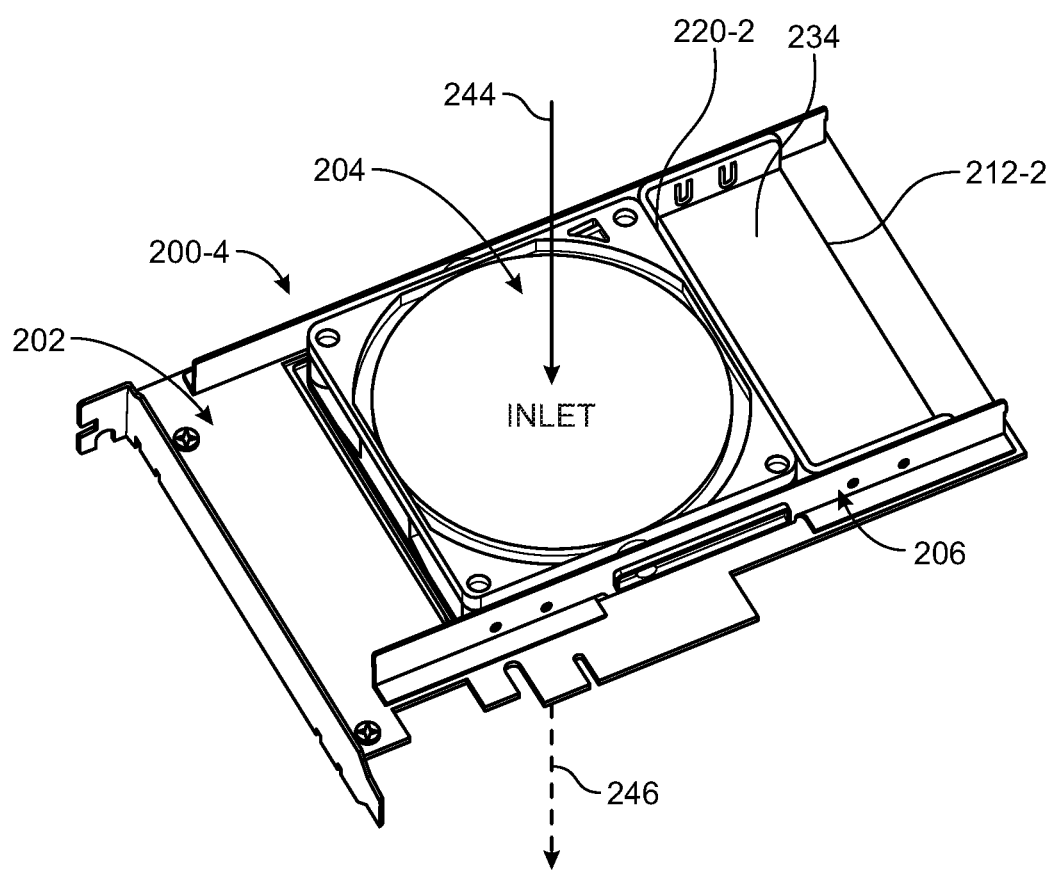

In positional state 4 of the fan device 200-4 illustrated in FIG. 5, the fan 204 is mounted in the operating position. As such, the airflow directing mechanism 234 is positioned and secured between the external lateral side 220-2 of the fan 204 and the internal lateral side 212-2 of the expansion card 202. For example, the sides of the airflow directing mechanism 234 partially or fully contact the lateral side 220-2 of the fan 204 and the lateral side 212-2 of the expansion card 202. As illustrated, arrows 244 and 246, respectively, represent airflow into the inlet and out of the outlet of the fan 204. As with positional state 1, the airflow is in a direction perpendicular to the pair of opposing surfaces 218 of the fan 204 and the pair of opposing surfaces 208 of the expansion card 202.

Figure 6:
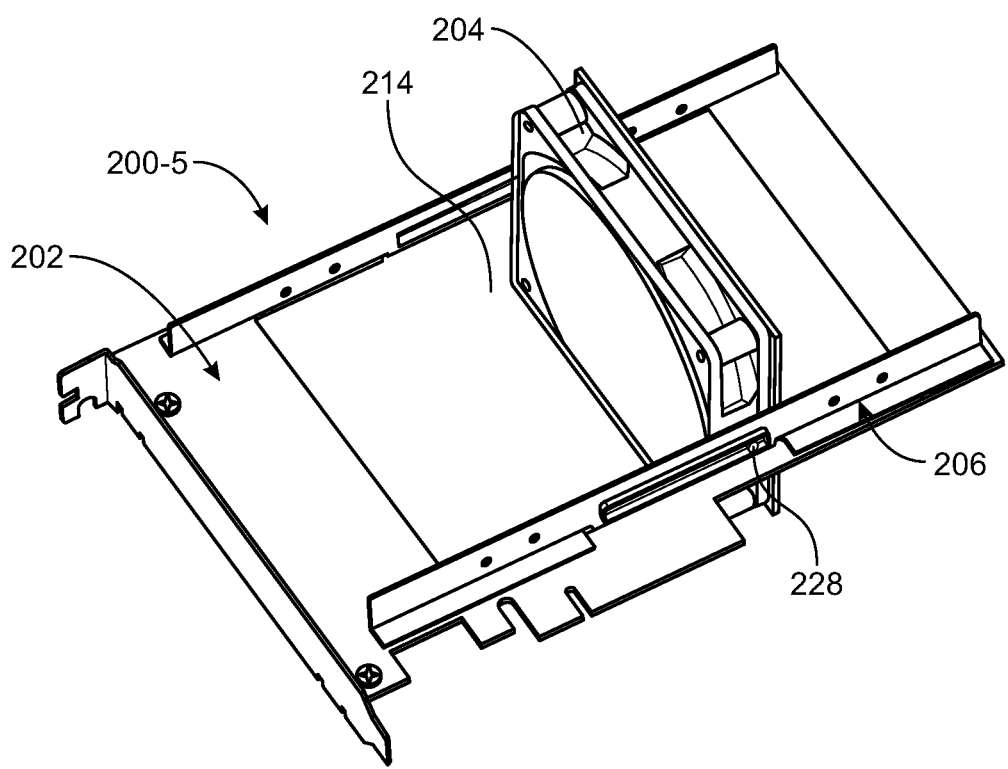

In positional state 5 of the fan device 200-5 illustrated in FIG. 6, the airflow directing mechanism 234 is removed leaving uncovered a portion of the opening 214. As illustrated, the fan 204 has been rotationally moved relative to the surfaces 208 of the expansion card 202 by 90 degrees as compared to positional states 1-4. For example, the mounting pins 228 of the mounting mechanism 206 permit the fan 204 to rotate within the opening 214 of the expansion card 202 through an orientation orthogonal to the surfaces 208 of the expansion card 202.

Figure 7:
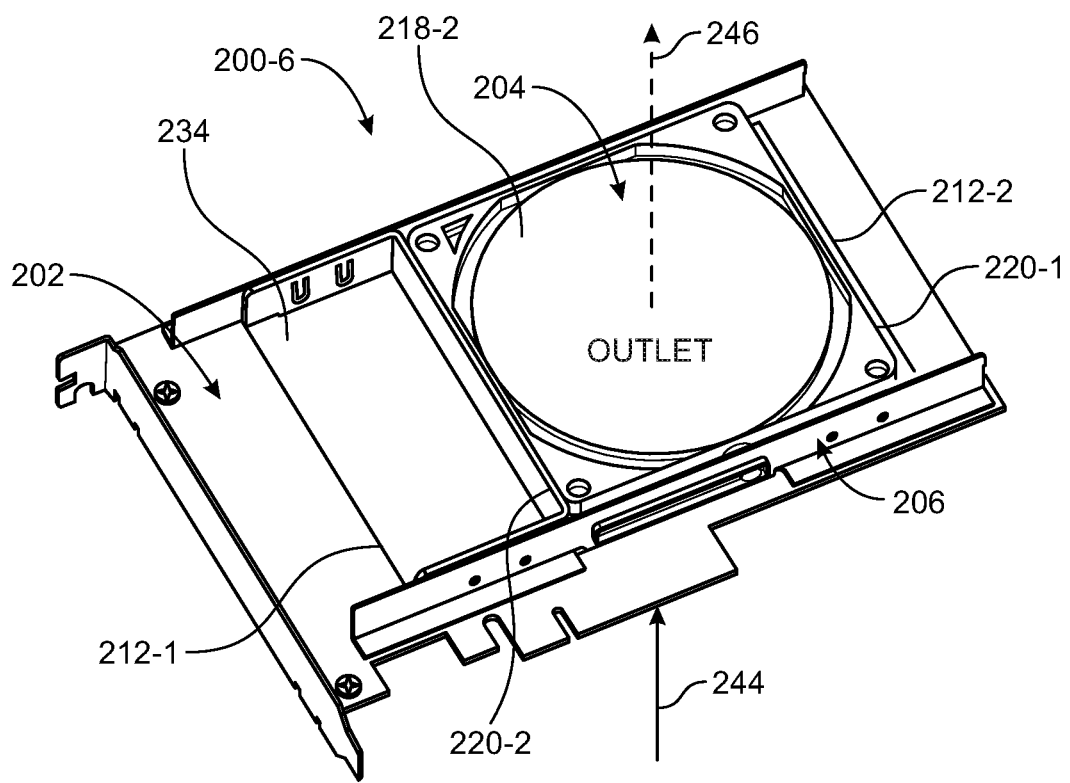

As illustrated by positional state 6 of the fan device 200-6 shown in FIG. 7, the mounting mechanism 206 permits the fan 204 to rotate at least 180 degrees relative to the surfaces 208 of the expansion card 202, such that the orientation of the fan 204 is rotated 180 degrees relative to the orientation of the fan 204 in positional states 1-4. In an implementation, the fan 204 may rotate 360 degrees relative to the surfaces 208 of the expansion card 202. In positional state 6, the fan 204 is mounted in the operating position. Additionally, in positional state 6, the external lateral side 220-1 of the fan 204 is adjacent to the internal lateral side 212-2 of the expansion card 202. In a particular implementation, the lateral side 220-1 of the fan 204 and the lateral side 212-2 of the expansion card 202 make partial or full contact.

Further, in positional state 6, the airflow directing mechanism 234 is positioned between the external lateral side 220-2 of the fan 204 and the internal lateral side 212-1 of the expansion card 202. In a particular implementation, sides of the airflow directing mechanism 234 partially or fully contact the lateral side 220-2 of the fan 204 and the lateral side 212-1 of the expansion card 202. As illustrated, arrows 244 and 246, respectively, represent airflow into the inlet and out of the outlet of the fan 204. The airflow is in a direction perpendicular to the pair of opposing surfaces 218 of the fan 204 and the pair of opposing surfaces 208 of the expansion card 202 and is opposite the direction of the airflow in positional state 1.

Figure 8:
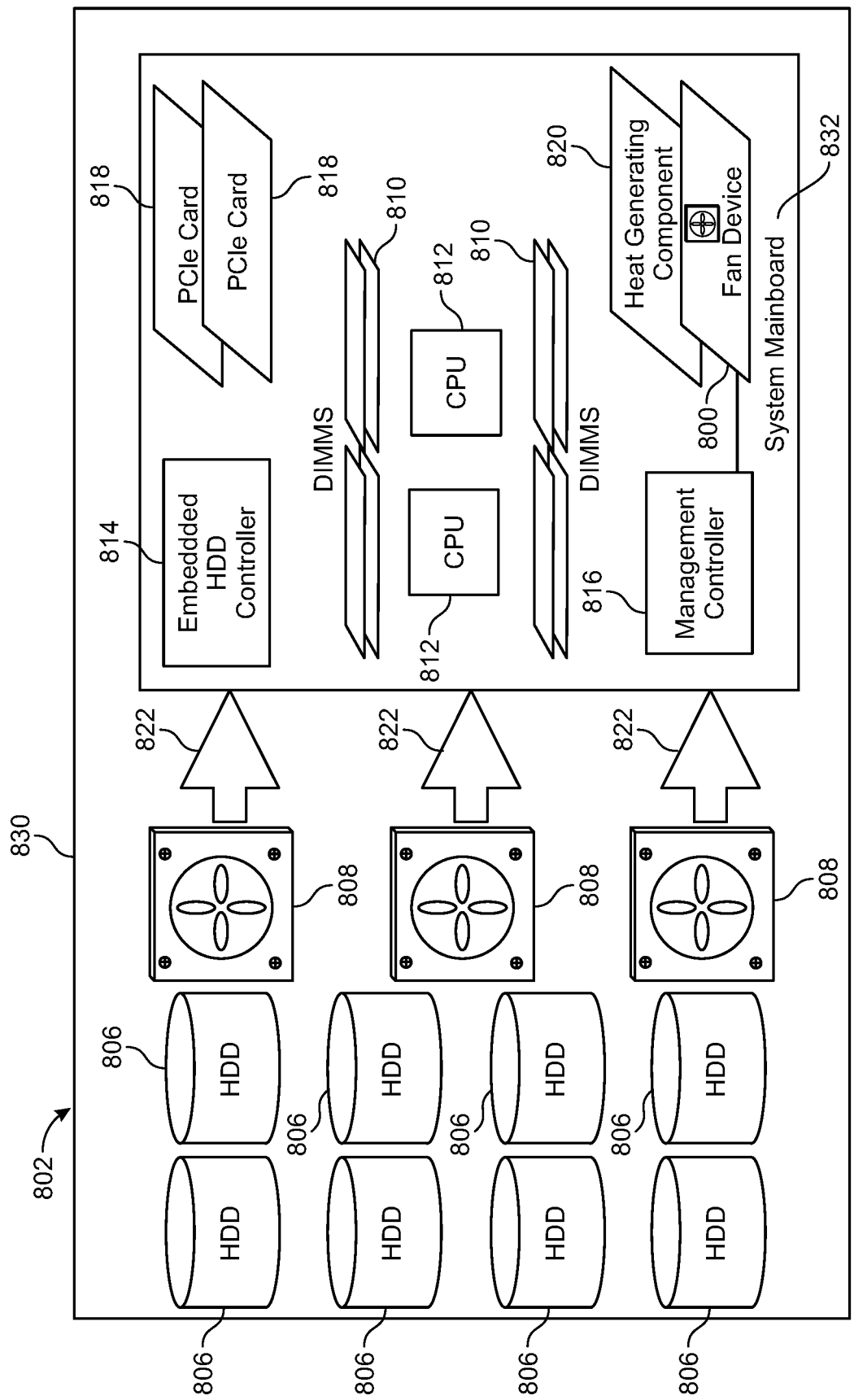
FIG. 8 depicts a block diagram of a computing system that includes a fan device, according to one or more examples of the present disclosure.

FIG. 8 depicts a block diagram of a computing system 802 that includes a fan device 800, according to one or more examples of the present disclosure. For example, the computing system 802 may represent a pluggable module, such as a memory or storage component, that may be inserted or installed into a component cage. However, the computing system 802 may be any suitable system that includes components that may be cooled using the fan device 800.

As illustrated, the computing system 802 has a housing or enclosure 830 that houses a plurality (8) of hard disk drives ("HDDs") 806, a plurality (3) of system fans 808, and a system mainboard 832 having a plurality of components mounted thereon. The system mainboard 832 is a main printed circuit board having mounted directly thereon (i.e., without connectors) various components internal to the computing system 802. The computing system 802 also includes a set of one or more mainboard connectors, each for connecting to a mated connector of an expansion device, to provide expanded functionality for the computing system 802. A mainboard connector may be directly mounted to the system mainboard 832 or mounted to another circuit board internal to the computing system 802 but that couples to the system mainboard 832.

In the illustrated example, the system mainboard 832 has directly mounted thereon a plurality (8) of dual in-line memory modules ("DIMMs") 810, a plurality (2) of central processing units ("CPUs") 812, an embedded HDD controller 814 (e.g., a MCU) for the HDDs 806, and a management controller 816 (e.g., a MCU). Also inserted into respective mainboard connectors (not shown) are a plurality of expansion devices including, two PCIe cards 818, a heat-generating component or device 820, and the fan device 800. The fan device 800 may be structurally and operationally similar to or the same as the fan device 100 of FIG. 1 and/or the fan device 200 of FIGS. 2-7. The heat-generating component 820 can be, for example, a network interface controller or a redundant array of independent disks ("RAID") control card.

During operation, the system fans 808 direct airflow in a direction toward the system mainboard 832, as indicated by the arrows 822. The airflow from the system fans 808 may not be sufficient to cool all of the components coupled to the system mainboard 832, particularly those furthest from the system fans 808. For example, the airflow from the system fans 808 may be insufficient to cool the heat-generating component 820. Accordingly, the fan device 800 may be inserted in and connected to a first mainboard connector of the set of mainboard connectors of the computing system 802 to cool or assist in cooling the heat-generating component 820. The heat-generating component 820 may mechanically connect to a second mainboard connector in the set of mainboard connectors.

In a particular example, so as to maximize airflow directly to the heat-generating component 820, an expansion card (not shown in FIG. 8) of the fan device 800 connects to a first connector in the set of mainboard connectors (not shown in FIG. 8), such that the expansion card is positioned adjacent to the heat-generating component 820. For instance, the heat-generating component 820 may include a longitudinal surface that is positioned parallel and adjacent to a surface in a pair of opposing surfaces of a fan (not shown in FIG. 8) included in the fan device 800. The longitudinal surface may be a surface of an expansion card of the heat-generating component 820 onto which electrical and/or electronic devices are mounted.

Additionally, as illustrated, the fan 800 is at least communicatively coupled to the management controller 816 (as illustrated by the solid line therebetween) to allow the management controller 816 to communicate with the fan 800. The communicative coupling between the fan 800 and the management controller 816 may allow information or data to be communicated therebetween. Such information or data may be, for instance, fan device status and fan speed as well as commands to adjust fan speed. Moreover, the computing system 802 may power the fan device 800 using the communicative coupling therebetween. Although not illustrated, the management controller 816 may also communicatively couple to one or more of the other expansion devices 818 and 820.

Figure 9:
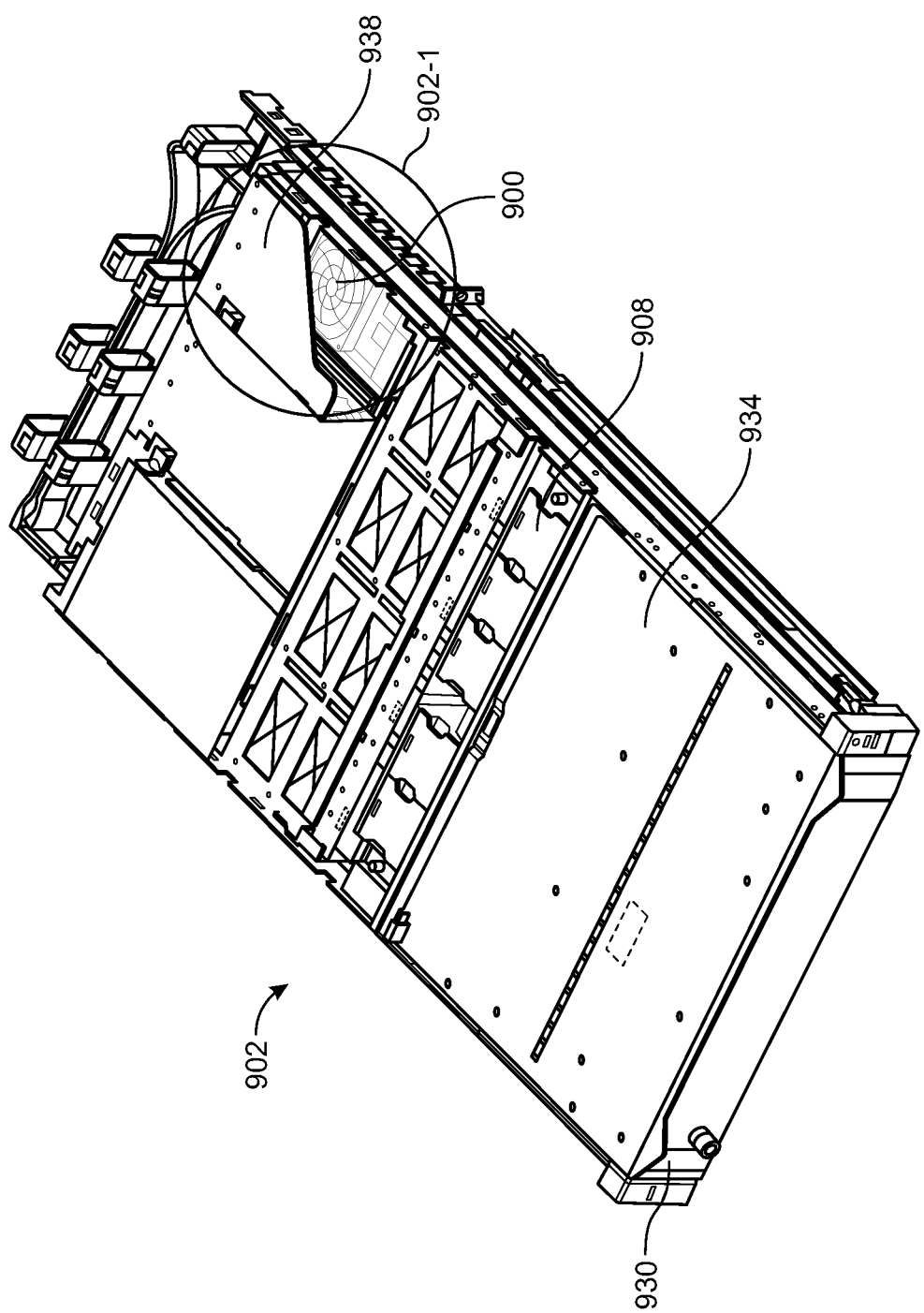
FIG. 9 depicts a computing system that includes a fan device, according to one or more examples of the present disclosure.

FIG. 9 depicts a computing system 902 that includes a fan device 900, according to one or more examples of the present disclosure. FIG. 9 depicts one example placement and orientation of a fan device relative to a heat-generating component. The fan device 900 may be structurally and operationally similar to or the same as the fan device 100 of FIG. 1 and/or the fan device 200 of FIGS. 2-7. The computing system 902 is illustrated as a pluggable module and includes one or more devices that may be represented within the computing system block diagram 800 shown in FIG. 8.

The computing system 902 has an enclosure 930 that houses multiple devices, including the fan device 900. For example, the computing system 902 may be a storage component having multiple HDDs (not shown) beneath a panel 934. The computing system 902 also includes system fans 908, five in this case (with only one labeled), to cool devices encased within the enclosure 930. The system fans 908 may provide insufficient airflow to adequately cool all these devices, such as an expandable heat-generating device (not shown) located within a segment 902-1 of the computing system 902 under a panel 938 and under the fan device 900.

Figure 10:
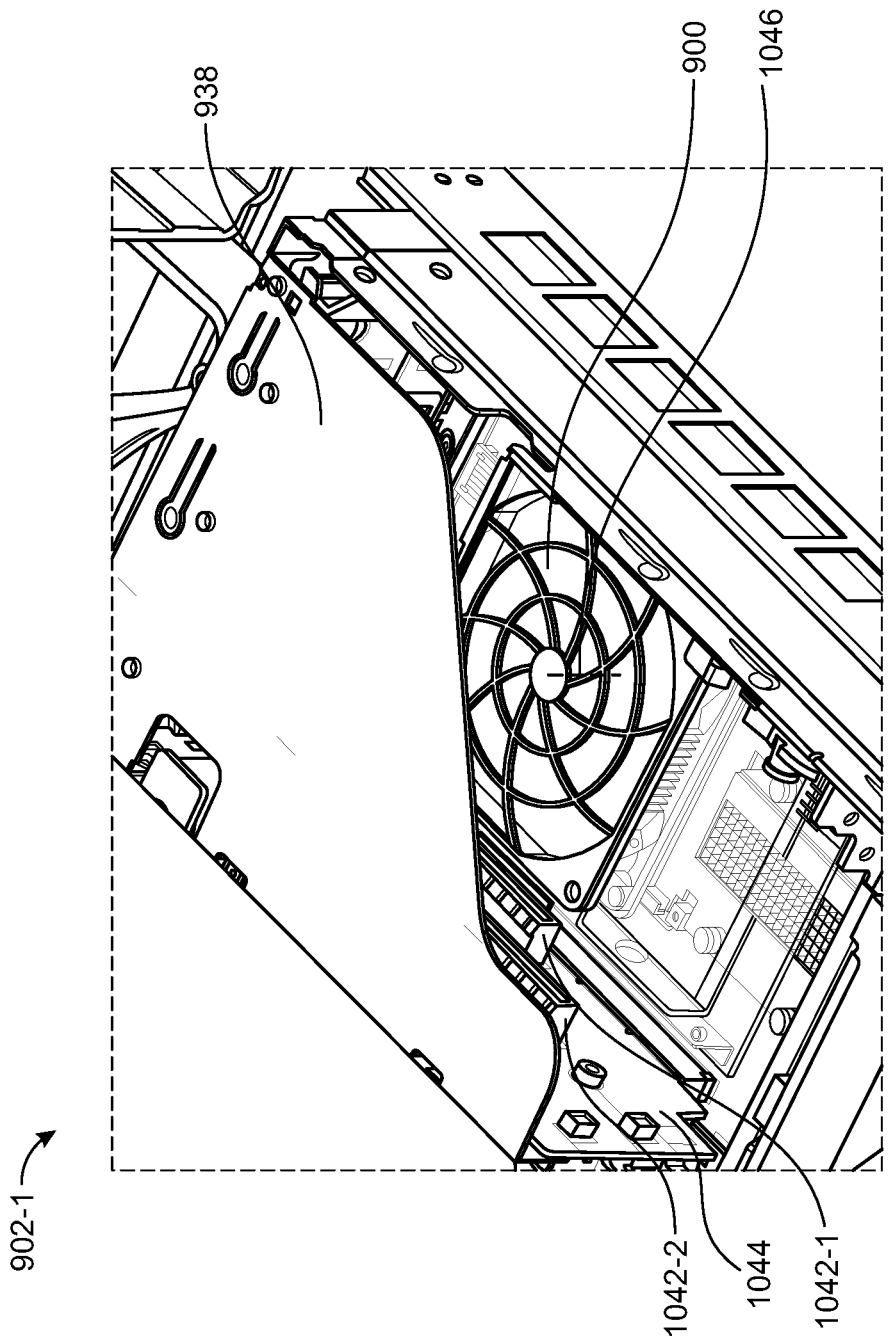
FIG. 10 depicts an enlarged view of a segment of the computing system illustrated in FIG. 9.

FIG. 10 depicts an enlarged view of the segment 902-1 of the computing system 902, illustrated in FIG. 9. The fan device 900 may be inserted into the computing system 902 to cool the heat-generating component (not visible), which is oriented such that electronic and or electrical devices mounted to an expansion card of the heat-generating component face toward the fan device 900. Accordingly, a fan of the fan device 900 may be oriented to an operating position such that airflow is in a direction indicated by an arrow 1046. Thus, the orientation may be in a direction 1046 toward on or more electronic and/or electrical devices of the heat-generating device, which generate heat. Moreover, the airflow generated by the fan device 900 is closer to the heat-generating component than the airflow generated by the system fans 908 and may be even more closely directed toward the source of heat by translating the fan along rails of a mounting mechanism of the fan device 900.

In this example, the computing system 902 includes a plurality of mainboard connectors 1042-1 and 1042-2 (collectively referred to as mainboard connectors 1042), which are not connected directly to a mainboard (not shown) of the computing system 902. The mainboard connectors 1042 are instead connected to another circuit board 1044 that is mechanically and communicatively coupled (e.g., through one or more connectors) to the mainboard. As further shown, the fan device 900 is inserted into the mainboard connector 1042-1. Moreover, the heat-generating device may be inserted into a mainboard connector (not shown) also mounted to the circuit board 1044, such that an expansion card of the fan device 900 is positioned adjacent to the heat-generating component. Also another expansion card may be inserted into the mainboard connector 1042-2.

Figure 11:
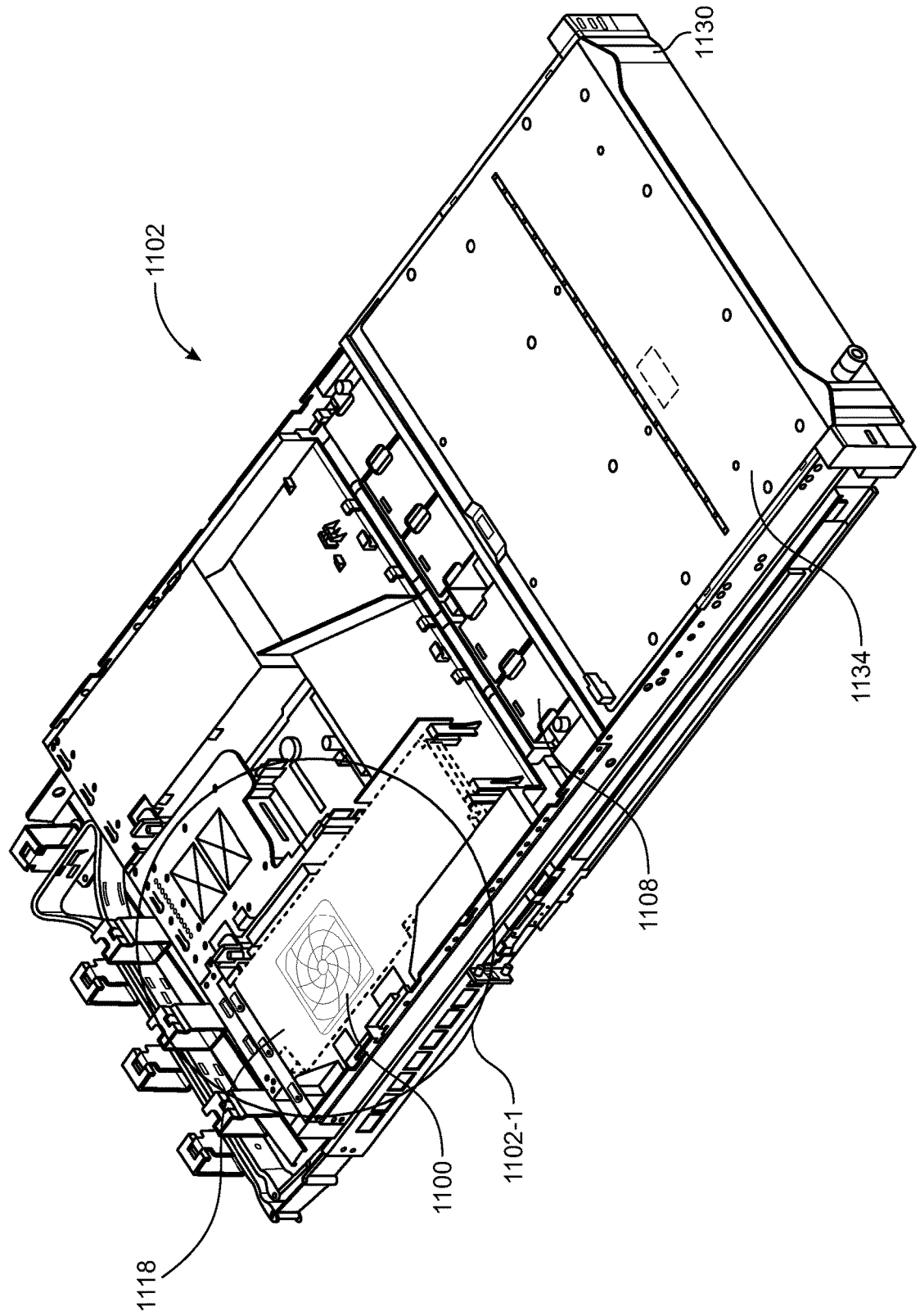
FIG. 11 depicts a computing system that includes a fan device, according to one or more examples of the present disclosure.

FIG. 11 depicts a computing system 1102 that includes a fan device 1100, according to one or more examples of the present disclosure. FIG. 11 depicts another example placement and orientation of a fan device relative to a heat-generating component. The fan device 1100 may be structurally and operationally similar to or the same as the fan device 100 of FIG. 1 and/or the fan device 200 of FIGS. 2-7. The computing system 1102 is illustrated as a pluggable module and includes one or more devices that may be represented within the computing system block diagram 800 shown in FIG. 8.

The computing system 1102 has an enclosure 1130 that houses multiple devices, including the fan device 1100. For example, the computing system 1102 may be a storage component having multiple HDDs (not shown) beneath a panel 1134. The computing system 1102 also includes system fans 1108, five in this case (with only one labeled), to cool devices encased within the enclosure 1130. The fans 1108 may provide insufficient airflow to adequately cool all these devices, such as an expandable heat-generating device 1118 located above the fan device 1100 within a segment 1102-1 of the computing system 1102.

Figure 12:
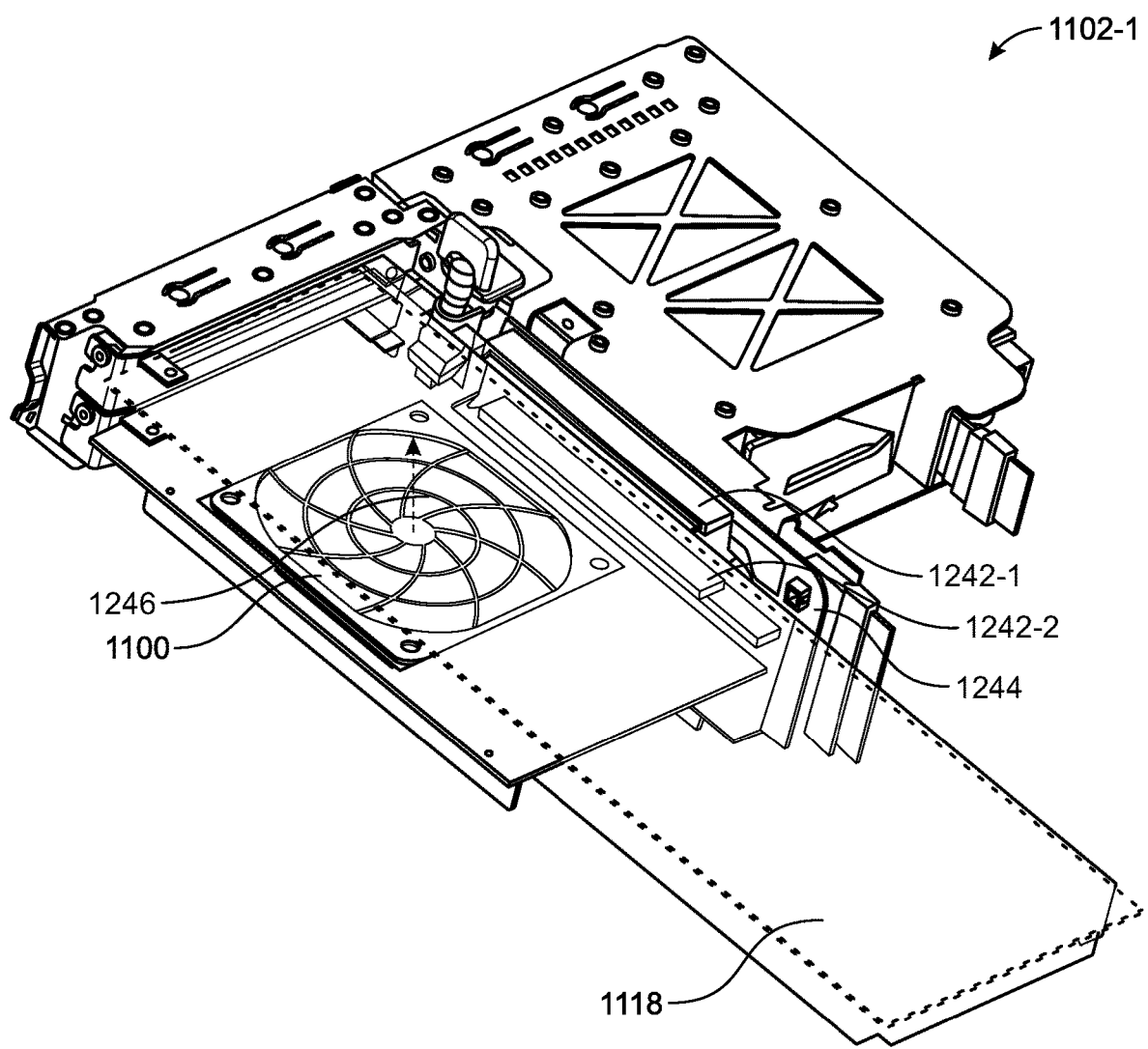
FIG. 12 depicts an enlarged view of a segment of the computing system illustrated in FIG. 11.

FIG. 12 depicts an enlarged view of the segment 1102-1 of the computing system 1100, illustrated in FIG. 11. The fan device 1100 may be inserted into the computing system 1102 to cool the heat-generating component 1118, which is oriented such that electronic and or electrical devices mounted to an expansion card of the heat-generating component 1118 face down toward the fan device 1100. Accordingly, a fan of the fan device 1100 may be oriented to an operating position such that airflow is in a direction indicated by an arrow 1246. Thus, the orientation may be in a direction 1246 toward one or more electronic and/or electrical devices of the heat-generating device 1118, which generate heat. Additionally, the direction 1246 is opposite the direction 1046 of the airflow of the fan device 900, to accommodate cooling heat-generating device having opposite relative orientations. Moreover, the airflow generated by the fan device 1100 is closer to the heat-generating component 1118 than the airflow generated by the system fans 1108 and may be even more closely directed toward the source of heat by translating the fan along rails of a mounting mechanism of the fan device 1100.

In this example, the computing system 1102 includes a plurality of mainboard connectors 1242-1 and 1242-2 (collectively referred to as mainboard connectors 1242), which are not connected directly to a mainboard (not shown) of the computing system 1102. The mainboard connectors 1242 are instead connected to another circuit board 1244 that is mechanically and communicatively coupled (e.g., through one or more connectors) to the mainboard. As further shown, the fan device 1100 is inserted into the mainboard connector 1242-2. Moreover, the heat-generating device 1118 is inserted into the mainboard connector 1242-1, such that an expansion card of the fan device 1100 is positioned adjacent to the heat-generating component 1118. Per the relative orientations of the fan device 1100 and heat-generating component 1118, the heat-generating component 1118 includes a longitudinal surface 1248 that is positioned parallel and adjacent to a surface in a pair of opposing surfaces of the fan of the fan device 1100.

Figure 13:
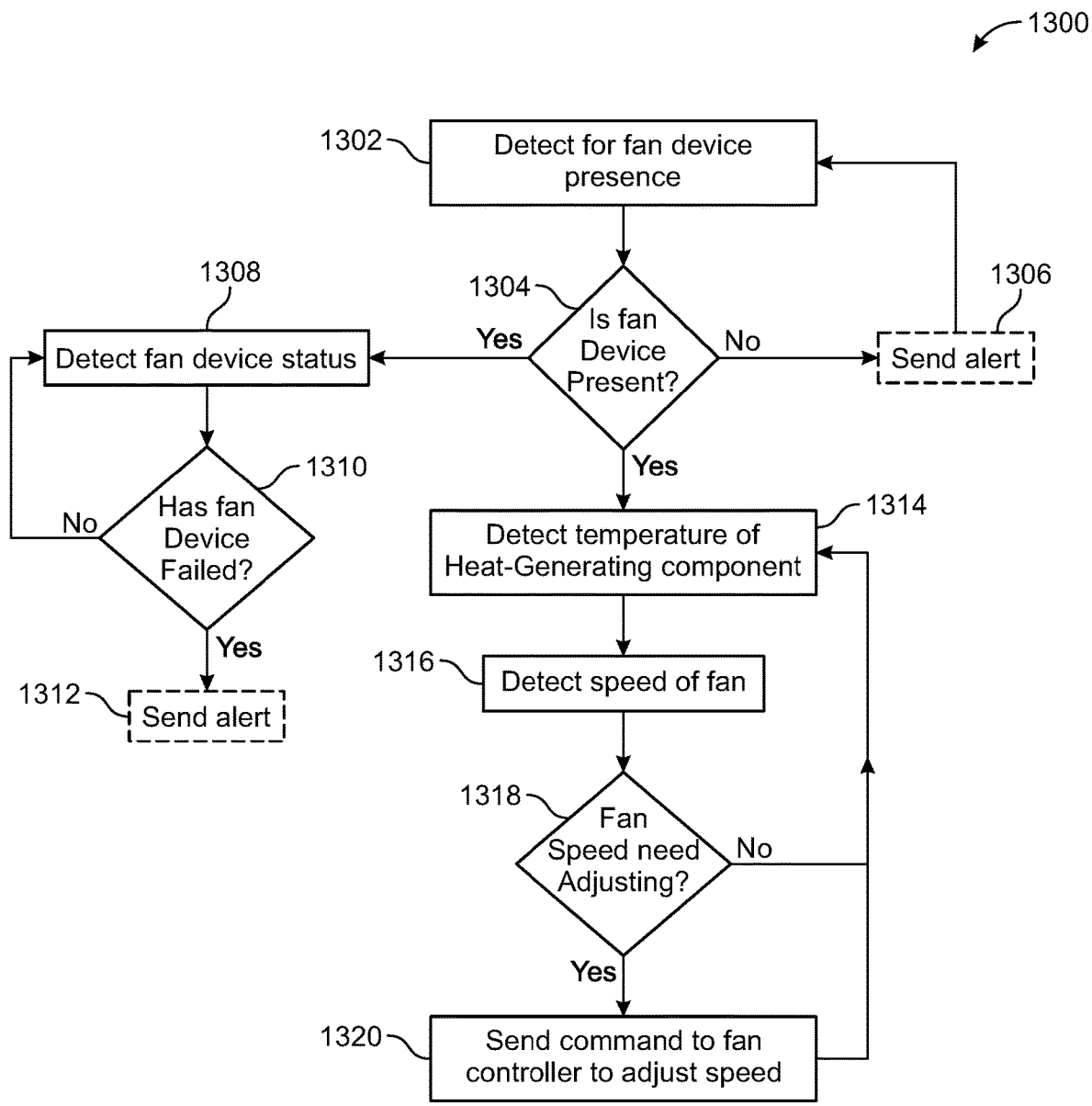
FIG. 13 depicts a flow diagram illustrating a method for communicating with and controlling a fan device, according to one or more examples of the present disclosure.

FIG. 13 depicts a flow diagram illustrating a method 1300 for communicating with and controlling a fan device, according to one or more examples of the present disclosure. In an example, the method is performed by a management controller that is communicatively coupled to fan device within a computing system, such as the management controller 816 communicatively coupled to the fan device 800 within the computing system 802. The method 1300 may be implemented using I2C protocol. In one or more other examples, the method 1300 may be partially implemented by the management controller 816 and partially implemented by a MCU of the fan device 800.

In a further example, the management controller includes a processor (not shown) and a memory device (not shown) for performing the method 1300 and can be for instance a management controller having the processor or memory device on a same printed circuit board, such as a MCU. However, processor and memory devices, within the computing system, which are not mounted to the same printed circuit board can be used. Moreover, a processor and/or memory device dedicated to communicating with the fan device may be implemented. Alternatively, a processor and/or memory device that communicate with several devices, such as several expansion devices that include the fan device, may be implemented.

Turning now to the method 1300, by reference to the management controller 816 and fan device 800 of FIG. 8, the management controller 816 detects (1302) for the presence of the fan device 800. For example, the management controller 816 attempts to read an identifier for the fan device 800 from an EEPROM of the fan device 800 or detects whether it has received the identifier from a MCU of the fan device 800. If the management controller 816 determines (1304) that the fan device 800 is not present, the management controller 816 continues to check (1302), for instance periodically, for the presence of the fan device 800. The management controller 816 may also generate and send (1306) an alert, for instance to notify a person monitoring the computing system 802 that the fan device 800 is not plugged into the computing system 802. The alert may be any suitable audio and/or visual alert provided though audio and/or visual output devices of or coupled to the computing system 802.

If the management controller 816 determines (1304) that the fan device 800 is present, the management controller 816 may begin to monitor (1308, 1310) a status of the fan device 1308 and perform functionality (1314, 1316, 1318) to determine whether to adjust the speed of a fan in the fan device 800. Particularly, the management controller 816 detects (1308) a status of the fan device 800, for instance to determine whether that fan device 800 is operating normally or has encountered a fault. In a particular example, a MCU processor of the fan device 800 writes data to one or more specified addresses of a MCU memory that indicates fan status, which the management controller 816 can read to detect the fan status.

In one implementation, the MCU memory addresses may store bits that directly indicate a status of NORMAL or FAULT for the fan device 800. The bits may also indicate a particular function, such as what type of data is stored in the address, e.g., fan status data, fan speed data, etc. To determine (1310), whether the fan device 800 has failed, the MCU memory may have stored therein a fan speed threshold to which the MCU processor may compare the current fan speed to determine and write to the designated MCU memory addresses the status of the fan device 800. For example, where the threshold is 20%, a fan speed less than 20% indicates a FAULT, and a fan speed 20% or greater indicates a NORMAL operation of the fan device 800.

Upon determining (1310) NORMAL operation of the fan device 800, the management controller 816 may periodically continue to detect (1308) the status of the fan device 800. Upon determining (1310) a FAULT, the management controller 816 may generate and send (1312) an alert as to the FAULT. The alert may be any suitable audio and/or visual alert provided though audio and/or visual output devices of or coupled to the computing system 802.

The management controller 816 may determine whether to adjust the fan speed of the fan device 800 based on the temperature of the heat-generating device, e.g., the heat-generating component 820, that fan device 800 is cooling.

Accordingly, the management controller 816 may detect (1314) the temperature of the heat-generating component 820. Temperature detection may be performed, for instance, by the management controller 816 receiving outputs from one or more heat detection sensors, e.g., thermistors, mounted to an expansion card of the heat-generating component 820.

The management controller 816 also detects (1316) a current fan speed of the fan device 800, and may determine (1318) whether to adjust the fan speed based on the temperature of the heat-generating component 820 and the current fan speed. In one implementation, a MCU memory address may store bits that directly indicate fan speed for fan device 800, which are accessible to the management controller 816 for reading and writing. A memory device of the management controller 816 may store a table that includes temperature ranges in one column and in other column store corresponding fan speeds sufficient to cool the heat-generating component 820. A processor of the management controller 816 may access the table to determine (1318) whether the fan speed needs to be adjusted higher or lower.

If the management controller 816 determines (1318) that the fan speed needs to be decreased or increased, the management controller 816 may send (1320) a command to the fan controller, e.g., the processor of the MCU, of the fan device 800 to change the fan speed. The MCU processor of the fan device 800 may write the new fan speed to the designated address of the MCU memory device and communicate with the fan to change its speed. Alternatively, the management controller 816 may write the new fan speed to the designated address of the MCU memory device of the fan device 800 and communicate the action to the MCU processor of the fan device to communicate with the fan to change its speed. If the management controller 816 determines (1318) that the fan speed does not need to be adjusted, the management controller may repeat the blocks included in loop 1314, 1316, and 1318.

The processor, which may also be referred to as a processing resource, used to implement the method 1300 may contain one or more hardware processors, where each hardware processor may have a single or multiple processor cores. Examples of processors include, but are not limited to, a CPU and a microprocessor. Also, the processing elements that make up processor may also include one or more of other types of hardware processing components, such as graphics processing units (GPU), application specific integrated circuits (ASICs), field-programmable gate arrays (FPGAs), and/or digital signal processors (DSPs). The memory device used to implement the method 1300 may be a non-transitory medium configured to store various types of data. For example, the memory device may include one or more storage devices that include a non-volatile storage device. Volatile memory, such as random-access memory (RAM), can be any suitable non-permanent storage device. The non-volatile storage devices can include one or more disk drives, optical drives, solid-state drives (SSDs), tape drives, flash memory, read only memory (ROM), and/or any other type of memory designed to maintain data for a duration of time after a power loss or shut down operation.

In a further example, a non-transitory computer-readable medium may store computer-executable instructions executable by one or more processors of the computing system via which the computer-readable medium is accessed, to perform the method 1300. A computer-readable media may be any available media that may be accessed by a computer. By way of example, such computer-readable media may comprise RAM, ROM, EEPROM, CD-ROM or other optical disk storage, magnetic disk storage or other magnetic storage devices, or any other medium that may be used to carry or store desired program code in the form of instructions or data structures and that may be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Further, as used herein, the article "a" is intended to have its ordinary meaning in the patent arts, namely "one or more." Herein, the term "about" when applied to a value generally means within the tolerance range of the equipment used to produce the value, or in some examples, means plus or minus 10%, or plus or minus 5%, or plus or minus 1%, unless otherwise expressly specified. Further, herein the term "substantially" as used herein means a majority, or almost all, or all, or an amount with a range of about 51% to about 100%, for example. Moreover, examples herein are intended to be illustrative only and are presented for discussion purposes and not by way of limitation.

The foregoing description, for purposes of explanation, used specific nomenclature to provide a thorough understanding of the disclosure. However, it will be apparent to one skilled in the art that the specific details are not required in order to practice the systems and methods described herein. The foregoing descriptions of specific examples are presented for purposes of illustration and description. They are not intended to be exhaustive of or to limit this disclosure to the precise forms described. Obviously, many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

What is claimed is:

1. A fan device comprising:
  an expansion card to mechanically and communicatively connect to a computing system;
  a fan;
  a mounting mechanism to mount the fan within an opening in the expansion card, wherein the mounting mechanism comprises a pair of rails connected to the expansion card and a pair of pins connected to opposite sides of the fan, wherein the rails comprise rail openings extending linearly along the rails and the pins are connected to the rails, respectively, in the rail openings such that the pins can translate and rotate relative to the rails and permit translation and rotation of the fan relative to the expansion card, wherein the rails comprises two mounting locations arranged on opposite sides of the rail openings; and
  a removable airflow directing mechanism configured to be removably mounted to the rails at either of the two mounting locations such that
    with the fan in a first position on the rails the removable airflow directing mechanism is mountable to a first of the mounting positions on a first side of the fan blocking a first portion of the opening in the expansion card; and
    with the fan in a second position on the rails the removable airflow directing mechanism is mountable to a second of the mounting positions on a second side of the fan blocking a second portion of the opening in the expansion card.

2. The fan device of claim 1, further comprising a controller mounted to the expansion card, the controller to:
communicatively couple to the fan; and
communicatively couple to the computing system through the expansion card.

3. The fan device of claim 1, wherein the airflow directing mechanism abuts the fan when the airflow directing mechanism is mounted to either of the mounting locations, the first portion of the opening extends from a first internal edge of the expansion card to a first edge of the fan, the second portion of the opening extends from a second internal edge of the expansion card to a second edge of the fan, and the first and second internal edges of the expansion card form parts of a rim of the opening in the expansion card arranged opposite from one another along a direction of translation of the fan.

4. The fan device of claim 1, wherein the mounting mechanism permits the fan to rotate at least 180 degrees relative to a surface of the expansion card through an orientation orthogonal to the surface of the expansion card.

5. The fan device of claim 1, wherein opposing sides of the fan are mounted parallel to opposing sides of the expansion card.

6. The fan device of claim 1, wherein the expansion card comprises an edge connector to mechanically and communicatively connect to the computing system.

7. The fan device of claim 1, wherein the expansion card has a standard form factor.

8. The fan device of claim 7, wherein the expansion card has a standard Peripheral Component Interconnect Express form factor.

9. The fan device of claim 1, further comprising a memory device mounted to the expansion card to store an identifier for the fan device.

10. A computing system comprising:
a heat-generating component;
a set of connectors; and
a fan device comprising:
an expansion card comprising a pair of opposing surfaces and a plurality of lateral sides connecting the pair of opposing surfaces, wherein the expansion card connects to a first connector in the set of connectors, such that the expansion card is positioned adjacent to the heat-generating component;
a fan comprising a pair of opposing surfaces and a plurality of lateral sides connecting the pair of opposing surfaces of the fan; and
a mounting mechanism that mounts the fan within an opening in the expansion card, in an operating position, such that the pair of opposing surfaces of the fan are positioned parallel to the pair of opposing surfaces of the expansion card wherein the mounting mechanism permits the fan to rotate, within the opening, at least 180 degrees relative to the expansion card, wherein the mounting mechanism comprises a pair of rails connected to the expansion card and a pair of pins connected to opposite lateral sides of the fan, wherein the rails comprise rail openings extending linearly along the rails and the pins are connected to the rails, respectively, in the rail openings such that the pins can translate and rotate relative to the rails and permit translation and rotation of the fan relative to the expansion card, wherein the rails comprises two mounting locations arranged on opposite sides of the rail openings; and
a removable airflow directing mechanism configured to be removably mounted to the rails at either of the two mounting locations such that
with the fan in a first position on the rails the removable airflow directing mechanism is mountable to a first of the mounting positions on a first side of the fan blocking a first portion of the opening in the expansion card; and
with the fan in a second position on the rails the removable airflow directing mechanism is mountable to a second of the mounting positions on a second side of the fan blocking a second portion of the opening in the expansion card.

11. The computing system of claim 10, wherein the heat-generating component comprises a longitudinal surface that is positioned parallel and adjacent to a surface in the pair of opposing surfaces of the fan.

12. The computing system of claim 10, wherein the expansion card further comprises an edge connector extending from a lateral side in the plurality of lateral sides of the expansion card, and wherein the edge connector mechanically and communicatively connects to the first connector.

13. The computing system of claim 10, wherein the mounting mechanism permits the fan to translate linearly relative to the expansion card.

14. The computing system of claim 10, wherein the fan device further comprises a memory device mounted to the expansion card to store an identifier for the fan device, and wherein the computing system further comprises a management controller to receive the identifier through the connection between the expansion card and the first connector.

15. The computing system of claim 10, wherein the airflow directing mechanism abuts the fan when the airflow directing mechanism is mounted to either of the mounting locations, the first portion of the opening extends from a first internal edge of the expansion card to a first edge of the fan, the second portion of the opening extends from a second internal edge of the expansion card to a second edge of the fan, and the first and second internal edges of the expansion card form parts of a rim of the opening in the expansion card arranged opposite from one another along a direction of translation of the fan.

16. The computing system of claim 10, wherein the expansion card is a standard Peripheral Component Interconnect Express ("PCI Express") card, and the first connector is a standard PCI Express slot.

* * * * *